United States Patent [19]

Trietley, Jr.

[11] 4,106,337
[45] Aug. 15, 1978

[54] MAGNETIC FLOW METER NULLING SYSTEM

[75] Inventor: Harry Louis Trietley, Jr., Brighton, N.Y.

[73] Assignee: Sybron Corporation, Rochester, N.Y.

[21] Appl. No.: 687,674

[22] Filed: May 19, 1976

[51] Int. Cl.² ............................................. G01F 1/60
[52] U.S. Cl. .................................................. 73/194 EM
[58] Field of Search ................................... 73/194 EM

[56] References Cited

U.S. PATENT DOCUMENTS

| | | | |
|---|---|---|---|
| 2,696,737 | 12/1954 | Mittelmann | 73/194 EM |
| 3,575,051 | 4/1971 | Moore | 73/194 EM |
| 3,802,263 | 4/1974 | Krechmery et al. | 73/194 EM |
| 3,977,246 | 8/1976 | Watanabe | 73/194 EM |

Primary Examiner—Charles A. Ruehl
Attorney, Agent, or Firm—Theodore B. Roessel; Joseph C. MacKenzie

[57] ABSTRACT

A magnetic flow meter nulling system wherein each electrode has connected thereto an in-phase voltage adjusting network and a phase-shifted voltage adjusting network. In particular, each electrode is connected in a loop with a slide wire of a potentiometer. The slider of one potentiometer is connected directly to the measuring circuit whereas the other potentiometer's slide wire has the slide wire of a third potentiometer connected across, the said other potentiometer having its slides connected directly to the measuring circuit and the slider of the third potentiometer being connected to the measuring circuit via a capacitor.

2 Claims, 2 Drawing Figures

MAGNETIC FLOW METER NULLING SYSTEM

FIELD OF THE INVENTION

This invention pertains to a system for nulling (i.e., adjusting to a minimum) the zero-or no-flow signal from a electromagnetic flowmeter.

THE PRIOR ART

Many previous nulling systems have been purely mechanical in nature, involving means of physically moving the electrode lead wire in the magnetic field until a minimum no-flow output signal is reached. A variation on this has been a mechanical device which instead of moving the lead wires, moved conductive or magnetic elements to induce eddy currents or otherwise distort the magnetic field in the vicinity of the electrode leads. Again, these are positioned for a minimum no-flow signal. With mechanical devices, the element adjusted must be located in the magnetic field. Therefore, the meter must either be nulled while in a state of partial disassembly or remotely located means mechanically connected to the adjustable elements must be provided for adjusting it in assembled state.

Other nulling systems have used electronic means, allowing the adjustment to be made on conveniently located potentiometers.

The simplest of these, using potentiometers having electrode lead loops, attempts to electrically adjust the "virtual center" of the leads, or of the electrodes themselves, for a minimum null. Although these systems work, they are not perfect because an amplitude adjustment only is available, but not phase. Hence, at null there generally is a slight phase difference between the electrode no-flow signal and the signal induced in the lead loop. This makes complete cancellation impossible.

Other electronic systems have included both amplitude and phase adjustment. These, however, have been unduly complex, generally requiring one or more transformers or at best, three leads to each electrode (two leads being for a signal pick up loop and one lead being a direct electrode connection).

SUMMARY OF THE INVENTION

The present invention, however, requires only one loop (two leads) for each electrode, yet allows both amplitude and phase adjustment thereby providing substantially complete nulling.

DETAILED DESCRIPTION OF THE DRAWINGS

Figure 1:
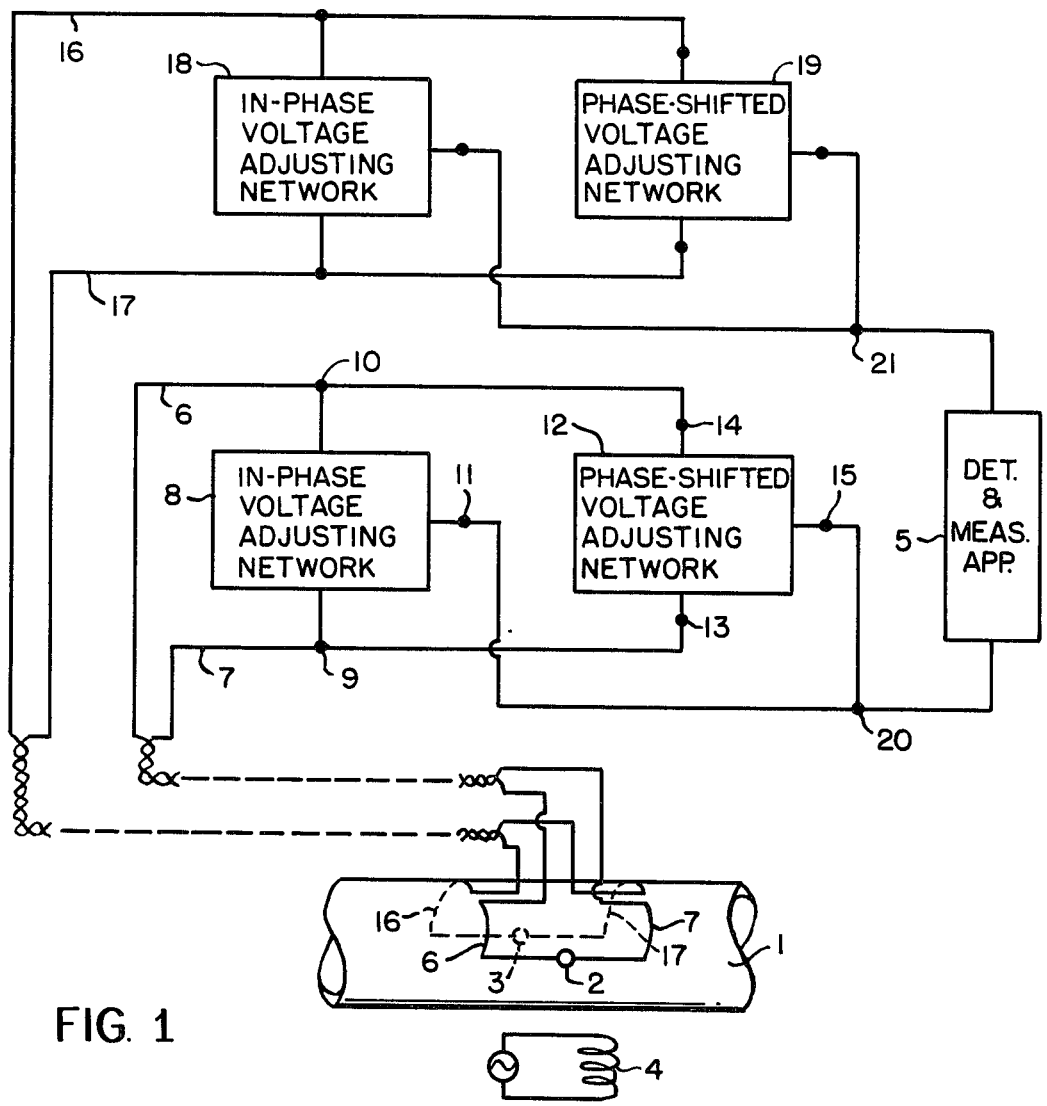
FIG. 1 shows a magnetic flowmeter nulling system according to the invention in the form of a box diagram.

In FIG. 1, reference numeral 1 denotes a conduit, through which an at least slightly conductive liquid is flowing. Diametrically disposed on the wall of conduit 1 are electrodes 2 and 3 which contact the liquid. A winding 4, or similar suitable magnetic field producing means, generates a magnetic field, normally alternating in sense, and directed transverse both to a line adjoining electrodes 2 and 3 and to the direction of flow through the pipe. This is a conventional so called electromagnetic flowmeter primary element. As is well known, the electrodes are connected to the terminals of suitable AC voltage detecting and measuring apparatus, which apparatus produces an output in proportion to the voltage induced in the liquid flowing between the electrodes. As is evident from its label, box 5 represents such detection and measuring apparatus.

Electrode 2 is connected in a nulling loop by a pair of wire leads 6 and 7. As will be seen from the Figure, leads 6 and 7 are twisted together except at their ends in the immediate vicinity of electrode where they form a loop which is fixed in the rectangular configuration shown, as, for example, by securing every point of the wire in the loop directly to the outer surface of conduit 1. Preferably, the electrode 2 is located at the center of the lower side of the rectangular loops, and in any event the electrode 2 is in effect an electrically conductive element of the loop formed by the ends of the leads 6 and 7. The twisted portion of the leads 6 and 7 runs to an in-phase voltage adjusting network represented by box 8, having input terminals 9 and 10 and an output terminal 11. Leads 6 and 7 continue on to a phase-shifted voltage adjusting network represented by box 12 having input terminals 13 and 14 and output terminal 15.

Electrode 3 is fitted out exactly like electrode 2 with leads 16 and 17 having their ends at the electrode forming a loop including the electrode and having a twisted portion connected to an in-phase voltage adjusting network 18 and thence to a phase-shifted voltage adjusting network 19. The output terminals of networks 8 and 12 are connected to input terminal 20 of circuit 5 and the output of networks 18 and 19 are connected to another input terminal 21 of circuit 5. Networks 18 and 19 are provided with input and output terminals exactly as are their respective counterparts, networks 8 and 12.

It is to be supposed that a voltage is induced in each electrode lead loop by the alternating magnetic field and further, that each network has the effective property of deriving from the induced voltage an algebraic sum of two voltages, one in phase with the induced voltage and one shifted in phase with respect to the induced voltage, both derived voltages being adjustable.

Accordingly, an electromagnetic flowmeter may be manufactured in completely assembled form regardless of whether or not completion results in a device having substantially zero voltage at no-flow. This is so, because if the finished primary element is found to put out non-zero voltage at zero flow, it is then necessary only to adjust one or more of the networks 8, 12, 13 and 19 in order to null out unwanted zero flow voltages.

Figure 2:
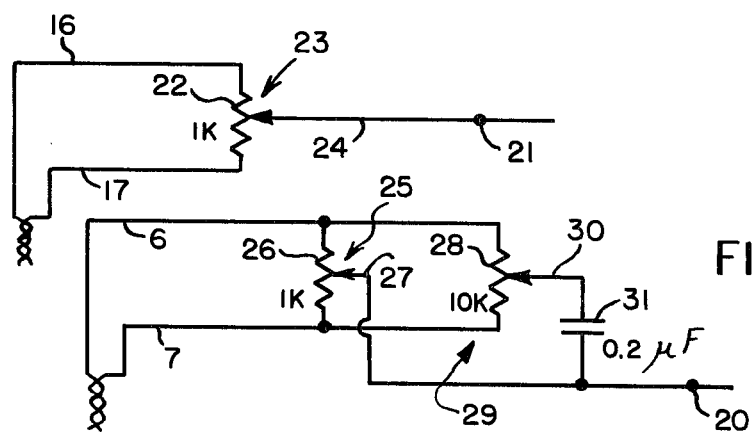
FIG. 2 is like FIG. 1 except the boxes are replaced by actual circuitry.

While the box diagram form of the circuit shown in FIG. 1, suggests a somewhat complex system of networks, in practice, that turns out not to be the case, as shown in FIG. 2 hereof. Thus, in FIG. 2, I not only take advantage of the fact that in general phase shifts can be taken care of by using just one phase-shifted adjustable source, but also that a source of in-phase voltage is right in the electrode loops. Accordingly, the loop of the electrode formed by leads 16 and 17 is completed by the slide wire 22 of a potentiometer 23 so as to allow adjusting the slider 24 of the potentiometer to a point on slide wire 22 where there is zero loop voltage at no-flow. The loop formed by leads 6 and 7 likewise is completed by potentiometer 25 having its slide wire 26 connected there across and a slider 27 which can be adjusted to a point on slide wire 26 where loop voltage is zero at no-flow.

Two potentiometers 23 and 25 obviously can accommodate stray voltages only if there is no phase shift. Therefore, to accommodate phase problems, I connect the slide wire 28 of a potentiometer 29 across the slide wire 26, and the slider 30 of potentiometer 29 I connect via a capacitor 31 to terminal 20, and therefore to the slider 27 of potentiometer 25.

In use, the conduit 1, which may supposed to be of uniform diameter, and a number of times its diameter in length, is stopped at both ends and solidly filled with conductive liquid. Magnetic field producing device 4 is energized and a suitable instrument (not shown) is connected to slider 24 to measure the voltage between it and any suitable reference point such as the fluid potential at the ends of the conduit. Slider 24 is now adjusted until such voltage as exists between it and the reference point is minimum. Because this adjustment does not include a phase-shifted adjusting network, said minimum voltage generally will not be zero. Likewise, the net voltage of slider 27, which includes the voltage of slider 30 shifted by capacitor 31, is measured, but this time in respect to the previously adjusted voltage on slider 24. The two sliders 27 and 30 are now adjusted for a minimum net signal, that is in practice, these two sliders can be easily adjusted to substantially null out the no-flow signal measured between terminals 21 and 20, substantially completely. Although some harmonics of the field supply frequency may not be thus reducible to zero, these will generally be rejected by the measuring circuitry 5 which is customarily designed to reject harmonics of the usual 60 hertz supply for the field.

The adjustment means that just described is capable of nulling out, substantially completely, the differential no-flow signal, that is, the no-flow signal measured between terminals 21 and 20. This is possible because the inclusion of a phase-shifted voltage adjusting network makes it possible to adjust the voltage on terminal 20 to be substantially equal to that on terminal 21. Because there is no phase-shifted adjusting network connected to terminal 21, however, it is generally not possible to completely null out the no-flow common mode voltage, that is, the no-flow voltage measured between either terminal 21 or terminal 20 and the above mentioned reference point. This generally is of no consequence, as the measuring circuitry 5 is customarily designed to reject common mode voltages, responding only to the differential voltage between terminals 21 and 20.

If it should be necessary to provide substantially complete nulling of the no-flow common mode voltage a capacitor and second potentiometer may be added to the nulling network connected to terminal 21 in a manner identical to that connected to terminal 20. Each network may then be independently adjusted for substantially zero no-flow voltage between each terminal and the reference point.

The adjusting technique is not critical, and can only be described as cut and try. In a typical system, slide wire 22 was 1 kilohm, slide wire 26 was 1 kilohm, slide wire 28 was 10 kilohms, and capacitor 31 was 0.2 microfarad. With this arrangement, when 24 was adjusted first, and sliders 27 and 30 were next adjusted in alternating fashion, the no-flow voltage between terminals 20 and 21 could be gotten down to 100 microvolts or less, said voltage consisting almost entirely of harmonics of the 60 hertz supply. Under exactly the same circumstances, using a standard commercial zero flow nulling technique, no-flow signals ranged from 150 microvolts up, including a substantial portion of the basic 60 herz supply. Furthermore, the aforesaid commercial form for the nulling system, namely, that used in the present assignee's 1100L flow primaries often requires that the zero be readjusted when changing the setting of the span dial on the detecting and measuring apparatus (the assignee's 1100T flow transmitter). In particular, on 0.1 inch and 0.2 inch diameter flow primaries having the aforesaid commercial nulling system, when after nulling the span is adjusted from 3 to 30 feet per second, there arises a 22 percent zero shift typically. Yet if the same transmitter is connected to the same primary elements fitted with nulling circuitry according to FIG. 2 of the present application, the same span change (i.e., from 3 ft/sec. to 30 ft/sec.) was found to produce less than 2 percent of zero shift.

Having described my invention as required by the Statute, I Claim:

1. An electromagnetic flowmeter system, including in combination,
    a. a primary element for producing an electrical potential difference proportional to the flow rate of flowing electrically-conductive material, and
    b. a detecting and measuring circuit for measuring said electrical potential difference such as to produce a measure of the rate of flow of said material through said primary element;
    c. said primary element having field means for producing an AC magnetic field in the path of said material and for directing said field transverse to the direction in which said material flows through said primary element;
    d. said primary element having a first electrode, the electrical potential of which is due to voltage at a first location in said material, due to flow of said material through and transverse to the direction of said field;
    e. said primary element having a second electrode, the electrical potential of which is due to voltage at a second location in said material, due to said flow of said material, said locations being spaced one from the other along a line transverse to said flow;
    f. said primary element having a first lead circuit connected to said first electrode and a first output terminal for presenting a first output voltage corresponding to the potential of said first electrode;
    g. said primary element having a second lead circuit connected to said second electrode and having a second output terminal for presenting a second output voltage corresponding to the potential of said second electrode;
    h. said first lead circuit having therein an adjusting element for adjusting the amplitude of said first output voltage with respect to the potential of said first electrode;
    i. said second lead circuit having therein an adjusting element for adjusting the amplitude of said second output voltage, with respect to the potential of said second electrode;
    j. said first lead circuit also having an adjusting element for adjusting the phase of said first output voltage with respect to the phase of said second output voltage; each said lead circuit comprising a pick-up loop; said loop incorporating the corresponding said electrode, and each said lead circuit including therein, remote from the corresponding said electrode, a potentiometer of which the slide wire is a series element of such loop, said slide wire being connected to an input terminal of said detecting and measuring circuit.

2. The electromagnetic flowmeter system of claim 1, wherein each said lead circuit includes pick-up loop means for generating, in said lead circuit, voltages due to alternating electromagnetic fields adjacent to such lead circuit;
    k. said second lead circuit further comprising a phase adjusting element.

* * * * *